(12) United States Patent
Jung

(10) Patent No.: US 6,188,619 B1
(45) Date of Patent: Feb. 13, 2001

(54) MEMORY DEVICE WITH ADDRESS TRANSLATION FOR SKIPPING FAILED MEMORY BLOCKS

(75) Inventor: Seong-ook Jung, Seoul (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/339,377

(22) Filed: Jun. 24, 1999

(30) Foreign Application Priority Data

Oct. 9, 1998 (KR) .................................................. 98-42174

(51) Int. Cl.$^7$ ....................................................... G11C 7/00
(52) U.S. Cl. ........................................ 365/200; 365/230.03
(58) Field of Search ............................... 365/200, 230.03, 365/230.02, 230.06, 225.7

(56) References Cited

U.S. PATENT DOCUMENTS

| 5,506,807 | * | 4/1996 | Ferrant et al. | 365/200 |
| 5,671,184 | * | 9/1997 | Meyer | 365/200 |
| 5,691,945 | * | 11/1997 | Liou et al. | 365/200 |
| 5,808,944 | * | 9/1998 | Yoshitake et al. | 365/200 |

* cited by examiner

Primary Examiner—David Nelms
Assistant Examiner—David Lam
(74) Attorney, Agent, or Firm—Eugene M. Lee, Esq.; The Law Offices of Eugene M. Lee P.L.L.C.

(57) ABSTRACT

A semiconductor memory device capable of operating normally even when a failed memory cell remains after repair. The semiconductor memory device includes a plurality of memory cell array blocks, and address decoding circuitry for receiving an address and for accessing good memory cell array blocks and skipping failed memory cell array blocks.

10 Claims, 5 Drawing Sheets

FIG. 5

| | FIRST MEMORY CELL ARRAY BLOCK | SECOND MEMORY CELL ARRAY BLOCK | THIRD MEMORY CELL ARRAY BLOCK | FOURTH MEMORY CELL ARRAY BLOCK | SELECTION SIGNAL GENERATION FUSE | | | | | | | | |
|---|---|---|---|---|---|---|---|---|---|---|---|---|---|
| | | | | | e2 (S0) | e8 (S1) | e14 (S2) | e20 (S3) | e26 (S4) | e32 (S5) | e38 (S6) | e44 (S7) | e50 (S8) |
| CASE 1 | GOOD | GOOD | GOOD | GOOD | F | | | | | | | | |
| CASE 2 | FAILED | GOOD | GOOD | GOOD | | F | F | F | | | | | |
| CASE 3 | GOOD | FAILED | GOOD | GOOD | F | | F | F | | | | | |
| CASE 4 | GOOD | GOOD | FAILED | GOOD | F | F | | F | | | | | |
| CASE 5 | GOOD | GOOD | GOOD | FAILED | F | F | F | | | F | | | |
| CASE 6 | FAILED | GOOD | FAILED | GOOD | | F | | F | | | | F | |
| CASE 7 | FAILED | GOOD | GOOD | FAILED | | F | F | | | | | F | |
| CASE 8 | GOOD | FAILED | GOOD | FAILED | F | | F | | F | | | | |
| CASE 9 | FAILED | FAILED | FAILED | GOOD | | F | | | | | | | F |
| CASE 10 | GOOD | FAILED | FAILED | GOOD | F | | | | | F | | | |
| CASE 11 | GOOD | FAILED | FAILED | GOOD | F | | | | | | F | | |

MEMORY DEVICE WITH ADDRESS TRANSLATION FOR SKIPPING FAILED MEMORY BLOCKS

BACKGROUND OF THE INVENTION

1. Field of the Invention

The present invention relates generally to a semiconductor device, and more particularly, to a semiconductor memory device capable of operating normally even when a failed memory cell exists after repair.

2. Description of the Related Art

A semiconductor memory device includes a plurality of memory cells which must be function properly in order for the memory device to function properly. However, during manufacture of the memory device, some of the memory cells may be defective. To solve this problem, semiconductor memory devices include redundant memory cells capable of being used in place of such failed memory cells. When failed memory cells are detected, the failed memory cells are replaced by the redundant memory cells to "repair" the memory device. This procedure improves the manufacturing yield, reducing the cost of manufacture of the memory devices.

However, if the number of failed memory cells is greater than the number of redundant memory cells capable of replacing the failed memory cells, the semiconductor memory device will not function properly. Thus, if any failed memory cells remain after the repair process, the semiconductor memory device is considered to be defective.

SUMMARY OF THE INVENTION

To solve the above problem, the present invention provides a semiconductor memory device capable of operating normally even when failed memory cells exist after the repair process.

Accordingly, there is provided a semiconductor memory device comprising a plurality of memory cell array blocks, wherein each memory cell array block comprises a plurality of memory cells, each memory cell being either good or defective, and address decoding circuitry for receiving an address and for accessing the memory cell array blocks having only good memory cells and skipping the memory cell array blocks having at least one defective memory cell. The address decoder preferably receives at least one selection signal indicating which memory cell array blocks have only good memory cells and which memory cell array blocks have at least one defective memory cell, and preferably includes a plurality of fuses for designating which memory cell array blocks have only good memory cells and which memory cell array blocks have at least one defective memory cell, the fuses being adapted to be cut, and wherein the selection signal is generated according to which fuses are cut.

In accordance with another aspect of the invention there is provided a semiconductor memory device comprising a plurality of memory cell array blocks, wherein each memory cell array block comprises a plurality of memory cells, each memory cell being either good or defective, and address decoding circuitry for receiving a first address, decoding the first address to provide a plurality of address signals, the address signals corresponding to the first address, and generating a plurality of internal address signals, the internal address signals corresponding to a second address. If the memory device has no memory cell array block having at least one defective memory cell, the second address is the same as the first address, and if the memory device has at least one memory cell array block having at least one defective memory cell, the second address is different from the first address.

In accordance with yet another aspect of the invention there is provided a method for addressing a plurality of memory cell array blocks in a memory device, comprising determining which memory cell array blocks of the plurality of memory cell array blocks have at least one defective memory cell, receiving a first address providing for access to one of the memory cell array blocks, decoding the first address to provide a plurality of address signals, the address signals corresponding to the first address, and generating a plurality of internal address signals, the internal address signals corresponding to a second address. If the memory device has no memory cell array block having at least one defective memory cell, the second address is the same as the first address, and if the memory device has at least one memory cell array block having at least one defective memory cell, the second address is different from the first address.

BRIEF DESCRIPTION OF THE DRAWINGS

The above features and advantages of the invention will become apparent upon reference to the following detailed description of specific embodiments and the attached drawings, of which:

FIG. 5 shows the fuses to be cut according to whether the memory cell array blocks are good or failed.

DETAILED DESCRIPTION OF SPECIFIC EMBODIMENTS

Figure 1:
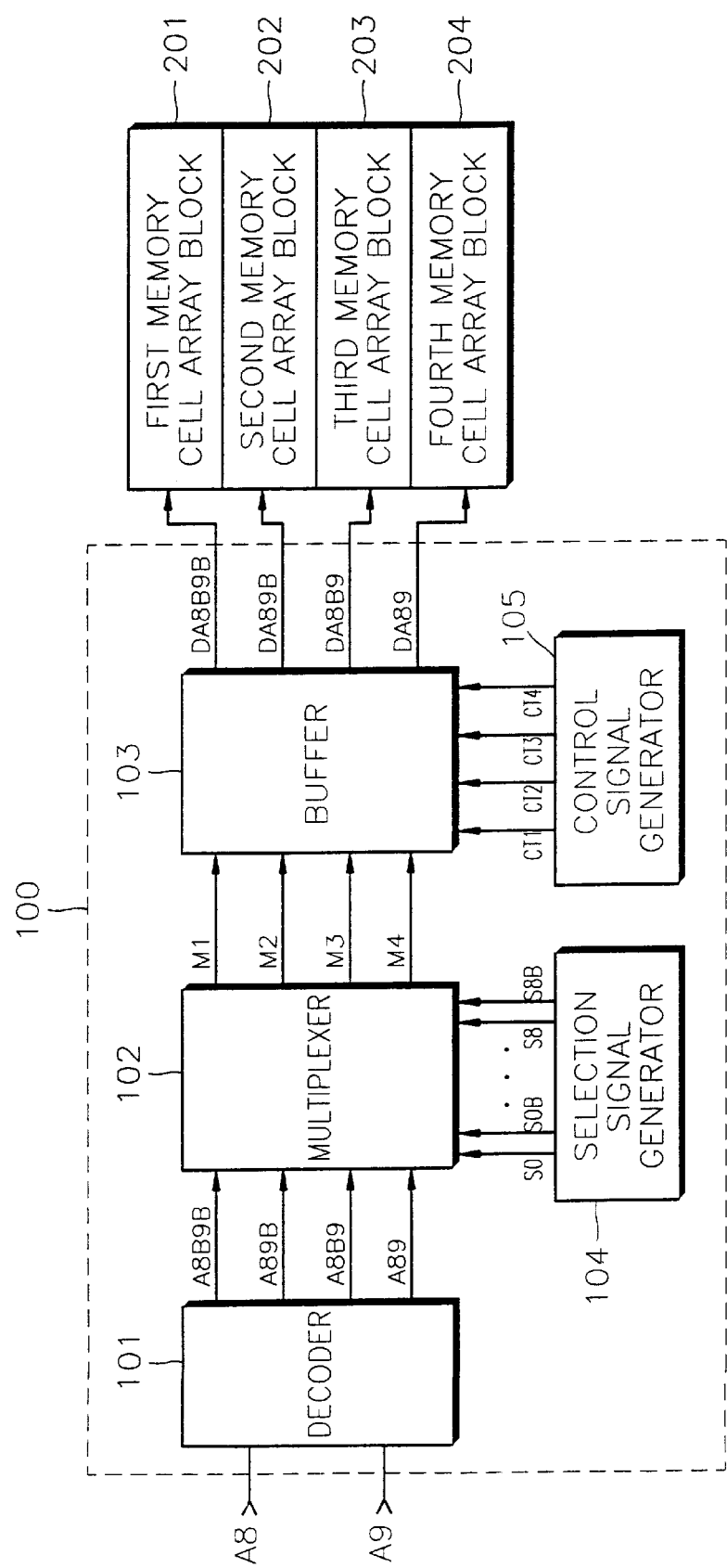
FIG. 1 is a block diagram of a semiconductor memory device according to the present invention.

Referring to FIG. 1, a semiconductor memory device according to the present invention includes first through fourth memory cell array blocks 201–204, and address decoding circuitry 100 for receiving an address (A8, A9). The address decoding circuitry 100 accesses only memory cell array blocks having normally operating memory cells ("good memory cell array blocks") among the first through fourth memory cell array blocks 201–204. The address decoding circuitry 100 skips over any memory cell array block which includes one or more failed memory cells which have not been replaced by redundant memory cells during the repair process ("failed memory cell array blocks"). Only four memory cell array blocks are shown in FIG. 1 for ease of explanation. However, it is obvious that more memory cell array blocks can be included. The address decoding circuitry of the present invention can be adapted for use with semiconductor memory devices having a large number of memory cell array blocks, as will be obvious from the following description.

The address decoding circuitry 100 includes a decoder 101, a multiplexer 102, a buffer 103, a selection signal generator 104, and a control signal generator 105. The decoder 101 decodes the address (A8, A9) to generate first through fourth address signals A8B9B, A89B, A8B9 and A89. The multiplexer 102 multiplexes the first through fourth address signals A8B9B, A89B, A8B9 and A89 in response to first through ninth selection signals S0–S8 and inverse selection signals S0B–S8B, to generate first through fourth output signals M1, M2, M3 and M4 such that only good memory cell array blocks are addressed.

Buffer 103 buffers the output signals M1, M2, M3 and M4, to generate first through fourth internal address signals DA8B9B, DA89B, DA8B9 and DA89 to access the memory cell array blocks 201–204. Buffer 103 also receives first through fourth control signals CT1, CT2, CT3, and CT4, and disables the internal address signals corresponding to any failed memory cell array blocks in response to control signals CT1, CT2, CT3 and CT4.

Selection signal generator 104 includes a plurality of fuses and generates the selection signals S0–S8 and inverse selection signals S0B–S8B. The selection signals SO–S8 are activated when a corresponding fuse is cut. The control signal generator 105 includes a plurality of fuses and generates the first through fourth control signals CT1, CT2, CT3 and CT4 which are activated when a corresponding fuse is cut.

Prior to describing the overall operation of the semiconductor memory device according to the present invention, the structures of each constituent part and the operation thereof will be described.

Figure 2:
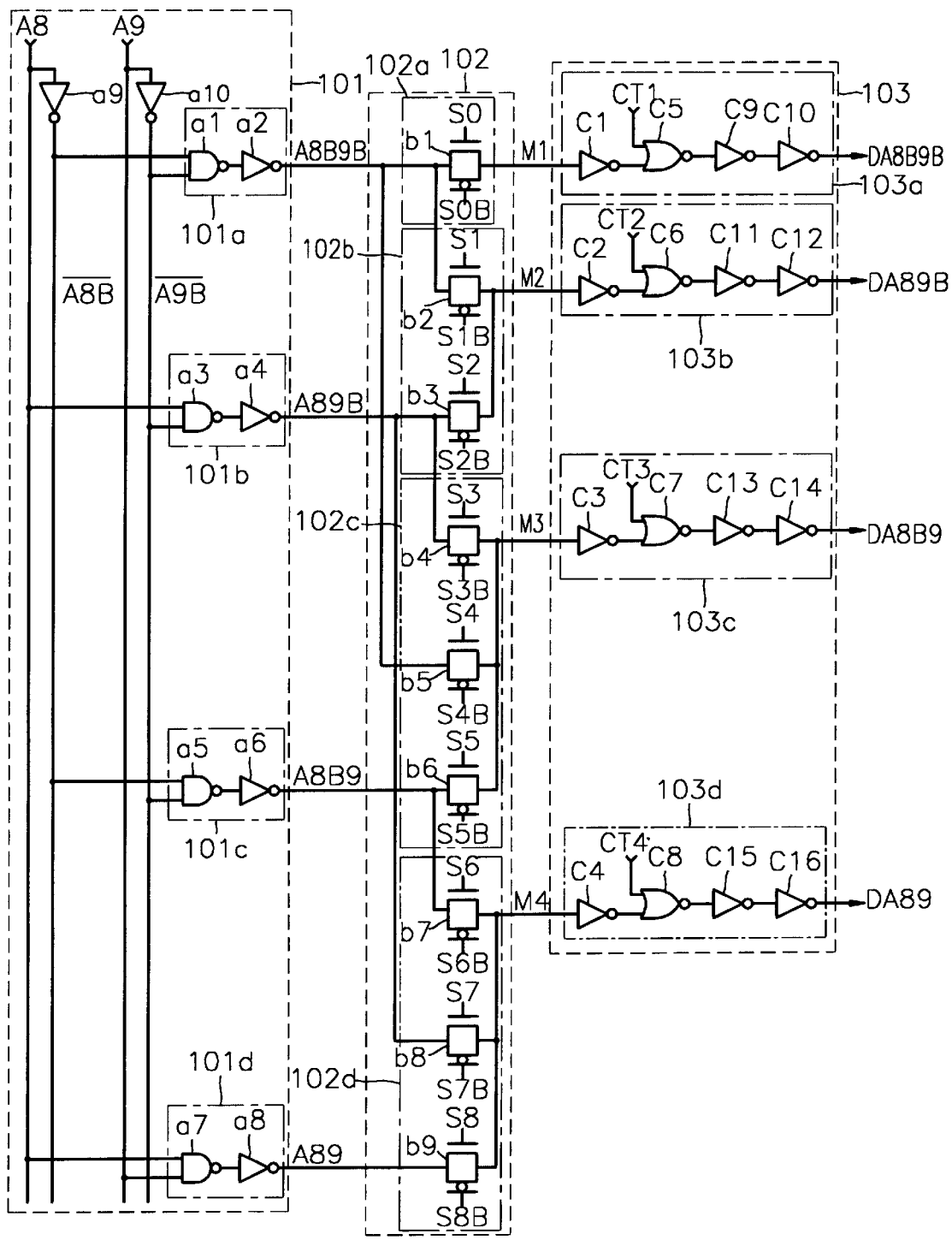
FIG. 2 is a detailed circuit diagram of a decoder, a multiplexer and a buffer shown in FIG. 1.

FIG. 2 is a detailed circuit diagram of the decoder 101, the multiplexers 102 and the buffer 103 shown in FIG. 1. Referring to FIG. 2, the decoder 101 includes inverters a9 and a10, and first through fourth decoding units 101a–101d. The inverter a9 inverts the address bit A8 to output an inverse address bit A8B, and the inverter a10 inverts the address bit A9 to output an inverse address bit A9B. The first decoding unit 101a includes a NAND gate a1 and an inverter a2, and activates the first address signal A8B9B to a logic high when the address (A8, A9) is 0,0. The second decoding unit 101b includes a NAND gate a3 and an inverter a4, and activates the second address signal A89B to a logic high when the address (A8, A9) is 1,0. The third decoding unit 101c includes a NAND gate a5 and an inverter a6, and activates the third address signal A8B9 to a logic high when the address (A8, A9) is 0,1. Finally, the fourth decoding unit 101d includes a NAND gate a7 and an inverter a8, and activates the fourth address signal A89 to a logic high when the address (AS, A9) is 1,1.

The multiplexer 102 includes first and fourth multiplexing units 102a–102d. The first multiplexing unit 102a includes a transfer gate b1 for transferring the first address signal A8B9B as the first output signal M1, in response to the first selection signal S0. The second multiplexing unit 102b includes a transfer gate b2 for transferring the first address signal A8B9B as the second output signal M2 in response to the second selection signal S1, and a transfer gate b3 for transferring the second address signal A89B as the second output signal M2 in response to the third selection signal S2. The third multiplexing unit 102c includes a transfer gate b4 for transferring the second address signal A89B as the third output signal M3 in response to the fourth selection signal S3, a transfer gate b5 for transferring the first address signal A8B9B as the third output signal M3 in response to the fifth selection signal S4, and a transfer gate b6 for transferring the third address signal A8B9 as the third output signal M3 in response to the sixth selection signal S5. The fourth multiplexing unit 102d includes a transfer gate b7 for transferring the third address signal A8B9 as the fourth output signal M4 in response to the seventh selection signal S6, a transfer fate b8 for transferring the second address signal A89B as the fourth output signal M4 in response to the eighth selection signal S7, and a transfer gate b9 for transferring the fourth address signal A89 as the fourth output signal M4 in response to the ninth selection signal S8.

Buffer 103 includes first through fourth buffer units 103a, 103b, 103c and 103d. The first buffer unit 103a includes inverters c1, c9 and c10, and a NAND gate c5, and buffers the first output signal M1 to output the first internal address signal DA8B9B for accessing the first memory cell array block 201. Also, the first buffer unit 103a disables the first internal address signal DA8B9B to a logic low when the first control signal CT1 is activated to a logic high. The second buffer unit 103b includes inverters c2, c11 and c12, and a NAND gate c6, and buffers the second output signal M2 to output the second internal address signal DA89B for accessing the second memory cell array block 202. Also, the second buffer unit 103b disables the second internal address signal DA89B to a logic low when the second control signal CT2 is activated to a logic high. The third buffer unit 103c includes inverters c3, c13 and c14, and a NAND gate c7, and buffers the third output signal M3 to output the third internal address signal DA8B9 for accessing the third memory cell array block 203. Also, the third buffer unit 103c disables the third internal address signal DA8B9 to a logic low when the third control signal CT3 is activated to a logic high. Lastly, the fourth buffer unit 103d includes inverters c4, c15 and c16, and a NAND gate c8, and buffers the fourth output signal M4 to output the fourth internal address signal DA89 for accessing the fourth memory cell array block 204. Also, the fourth buffer unit 103d disables the fourth internal address signal DA89 to a logic low when the fourth control signal CT4 is activated to a logic high.

Figure 3:
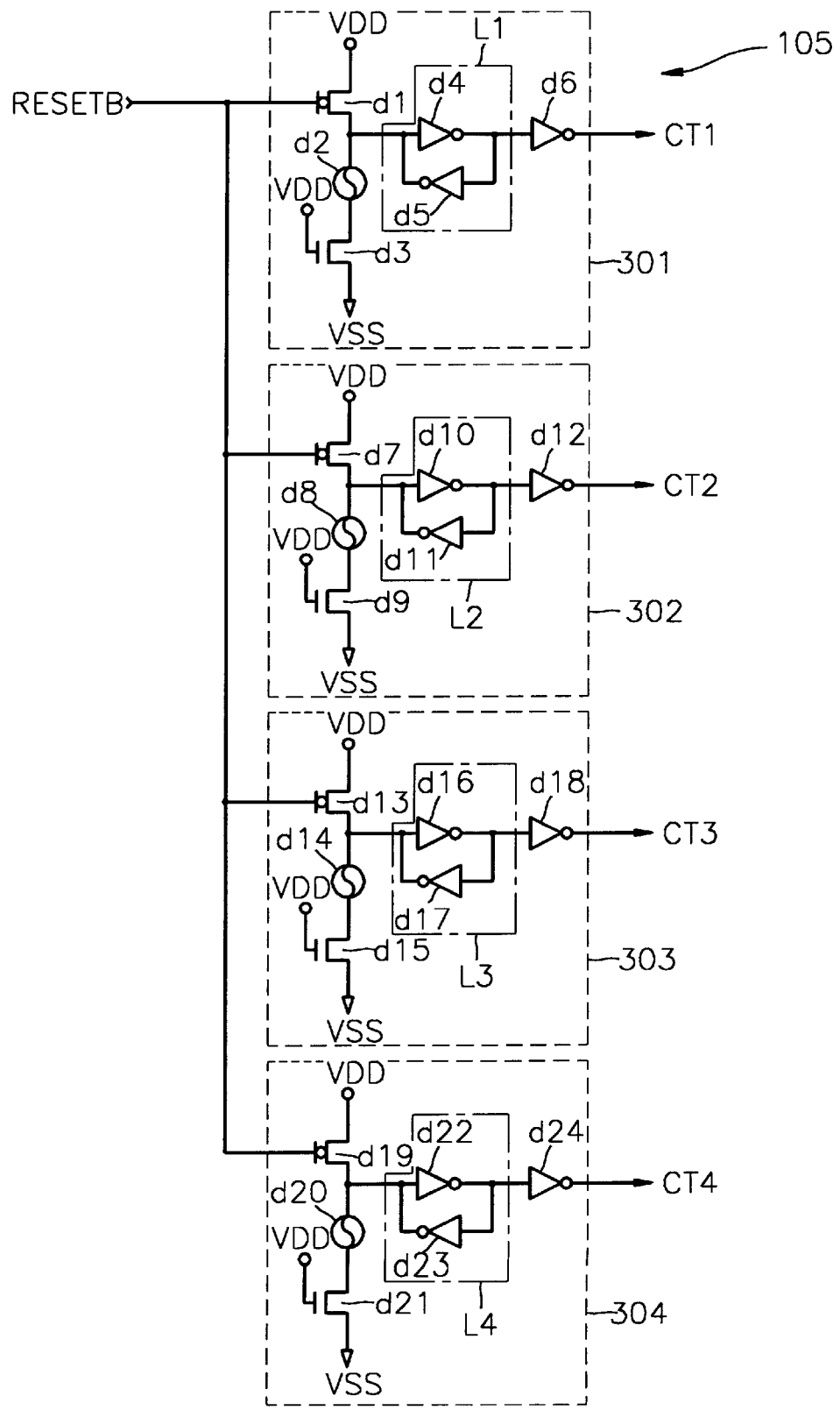
FIG. 3 is a detailed circuit diagram of a control signal generator shown in FIG. 1.

FIG. 3 is a detailed circuit diagram of the control signal generator 105 shown in FIG. 1. Referring to FIG. 3, the control signal generator 105 includes first through fourth control signal generating units 301–304. The control signal generating units 301–304 include PMOS pull up transistors d1, d7, d13 and d19, fuses d2, d8, d14 and d20, NMOS pull down transistors d3, d9, d15 and d21, latches L1, L2, L3 and L4, and inverters d6, d12, d18 and d24, respectively.

When fuse d2 of the first control signal generating unit 301 is not cut, discharging occurs through fuse d2 and the NMOS pull down transistor d3, because the NMOS pull down transistor is always turned on. Thus, the input to latch L1 is a logic low, the output of latch L1 becomes a logic high, and inverter d6 inverts the output of latch L1 to generate a logic low as the first control signal CT1. When fuse d2 is cut, the PMOS pull up transistor d1 is turned on by a logic low state of the inverse reset signal RESETB. Thus, the input to latch L1 is a logic high, the output of latch L1 becomes a logic low, and inverter d6 inverts the output of latch L1 to generate a logic high as the first control signal CT1. Thus, the first control signal CT1 is set to a logic high when fuse d2 is cut.

The second, third and fourth control signal generating units 302, 303 and 304 operate in the same manner as the first control signal generating unit 301. That is, the second control signal CT2 is set to a logic high when fuse d8 is cut, the third control signal CT3 is set to a logic high when fuse d14 is cut, and the fourth control signal CT4 is set to a logic high when fuse d20 is cut.

Figure 4:
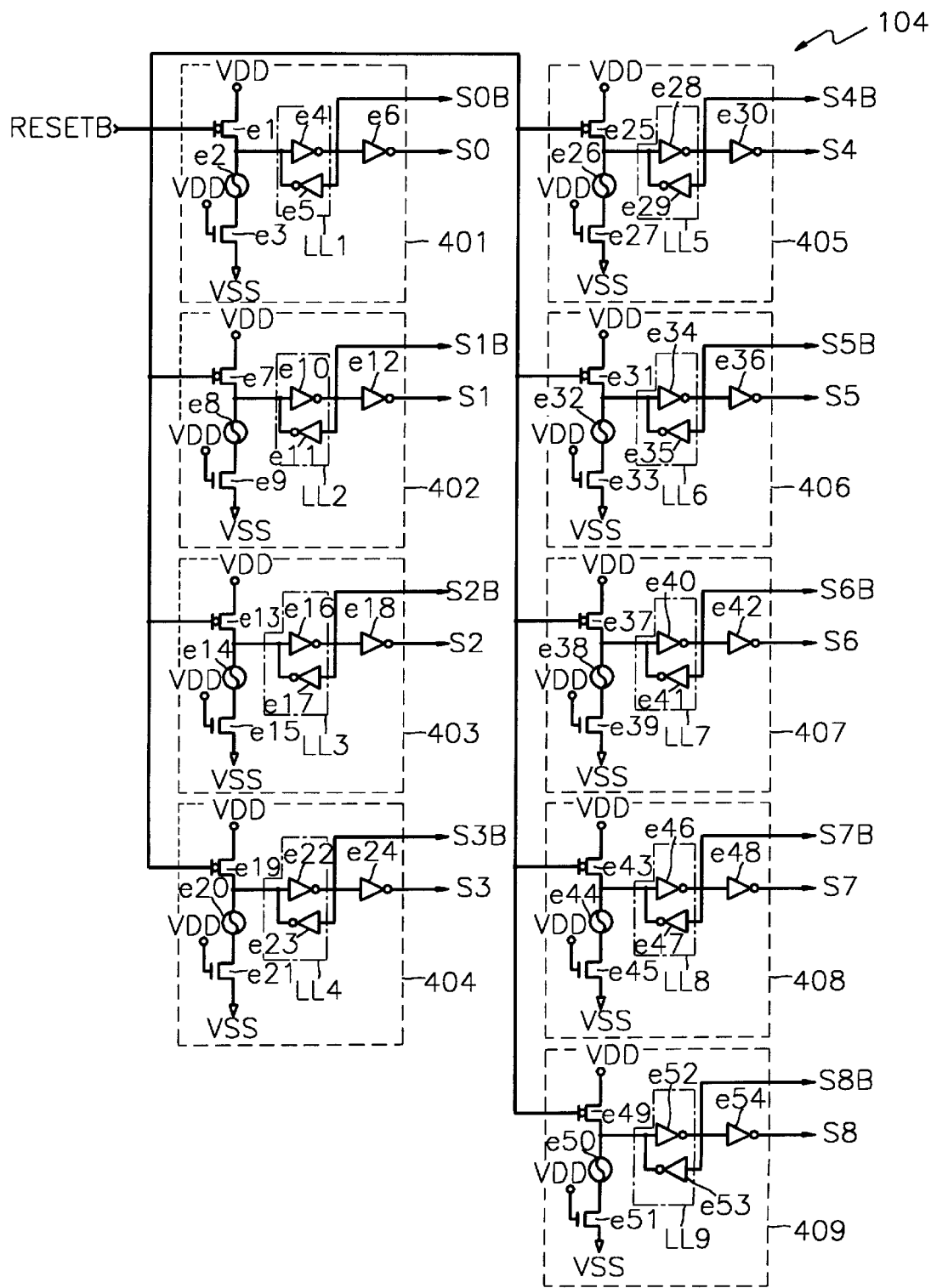
FIG. 4 is a detailed circuit diagram of a selection signal generator shown in FIG. 1.

FIG. 4 is a detailed circuit diagram of the selection signal generator 104 shown in FIG. 1. Referring to FIG. 4, the selection signal generator 104 includes first through ninth selection signal generating units 401–409. The selection signal generating units 401–409 include PMOS pull up transistors e1, e7, e13, e19, e25, e31, e37, e43 and e49, fuses e2, e8, e14, e20, e26, e32, e38, e44 and e50, NMOS pull down transistors e3, e9, e15, e21, e27, e33, e39, e45 and e51, latches LL1, LL2, LL3, LL4, LL5, LL6, LL7, LL8 and LL9, and inverters e6, e12, e18, e24, e30, e36, e42, e48 and e54, respectively.

When fuse e2 of the first selection signal generating unit 401 is not cut, discharge occurs through fuse e2 and the NMOS pull down transistor e3, because the NMOS pull down transistor is always turned on. Thus, the input to latch LL1 is a logic low, the output SOB of latch LL1 becomes a logic high, and inverter e6 inverts the output of latch LL1 to generate a logic low as the first selection signal S0.

When fuse e2 is cut, the PMOS pull up transistor e1 is turned on by a logic low state of the inverse reset signal RESETB. Thus, the input to latch LL1 is logic high, the output of SOB of latch LL1 becomes a logic low, and inverter e6 inverts the output of latch LL1 to generate a logic high as the first selection signal S0.

The second through ninth selection signal generating units 402–409 operate in the same manner as the first selection signal generating unit 401, and the explanation thereof will be omitted to avoid duplication.

The overall operation of the semiconductor memory device according to the present invention will now be described in detail with reference to FIGS. 1–4, and compared to the operation of a conventional semiconductor memory device.

In a conventional semiconductor memory device, the address decoder does not include a multiplexer, a selection signal generator, or a control signal generator, unlike the address decoder of the present invention. In a conventional device, the decoder is directly connected to a buffer. Thus, when an address (A8, A9) is applied in sequence to the conventional semiconductor memory device, the first through fourth memory cell array blocks are accessed in sequence. For example, when the address (A8, A9) is applied as (0,0), (1,0), (0,1) and (1,1) in sequence, first through fourth address signals A8B9B, A89B, A8B9 and A89 of the decoder become active in sequence. Accordingly, first through fourth internal address signals DA8B9B, DA89B, DA8B9 and DA89 are activated, in sequence, so that the first through fourth memory cell array blocks are accessed in sequence. However, if one of the memory cell array blocks includes a failed memory cell, the conventional semiconductor memory device has no capability to bypass that filed memory cell array block.

This problem is addressed in a conventional device by a "repair" process involving replacing the failed memory cells by redundant memory cells during the manufacturing process. But if there are more failed memory cells than redundant memory cells capable of replacing the failed cells, the device is discarded as defective during the manufacturing process. In other words, if a memory cell array block contains at least one failed memory cell after such repair, the semiconductor memory device is regarded as defective.

In the semiconductor memory device according to the present invention, when at least one of the memory cell array blocks 201–204 includes a failed memory cell after repair, the fuse in control signal generator 105 corresponding to the failed memory cell array block (i.e. the memory cell array block having the failed memory cell) is cut. As a result, the corresponding signal of the internal address signals DA8B9B, DA89B, DA8B9 and DA89 is disabled, so that the address decoder skips the failed memory cell array block. Thus, the failed memory cell array block is not accessed.

In addition, selected fuses in selection signal generator 104 are cut so that only the good memory cell array blocks having no failed memory cells are accessed. The selection signals S0–S8 generated by selection signal generator 104 cause the multiplexer 102 to redirect the address signals A8B9B, A89B, A8B9 and A89 to the output signals M1, M2, M3 and M4 corresponding to the good memory cell array blocks. Thus, when the address (A8, A9) is applied, only the good memory cell array blocks of the memory cell array blocks 201–204 are accessed.

For example, assuming that only the first memory cell array block 201 is a failed memory cell array block, the fuse d2 of the first control signal generating unit 301 is cut to activate the first control signal CT1 to a logic high. Accordingly, the first internal address signal DA8B9B of buffer 103 (shown in FIG. 2) is disabled to a logic low. As a result, the first memory cell array block 201 is not accessed regardless of the address (A8, A9) applied to the decoder 101.

Next, fuse e8 of the second selection signal generating unit 402, fuse e20 of the fourth selection signal generating unit 404, and fuse e38 of the seventh selection signal generating unit 407 are cut, to activate the second, fourth and seventh control signals S1, S3, and S6 to a logic high. As a result, transfer gates b2, b4, and b7 of multiplexer 102 (shown in FIG. 2) turn on. Transfer gate b2 transfers the first address signal A8B9B as the second output signal M2, which is buffered by second buffering unit 103b, and then output as the second internal address signal DA89B. Transfer gate b4 transfers the second address signal A89B as the third output signal M3, which is buffered by the third buffering unit 103c, and then output as the third internal address signal DA8B9. Transfer gate b7 transfers the third address signal A8B9 as the fourth output signal M4, which is buffered by the fourth buffering unit 103d, and then output as the fourth internal address signal DA89.

When the address (A8, A9) is (0, 0), the first through fourth address signals (A8B9B, A89B, A8B9, A89) become (1, 0, 0, 0), and the first through fourth internal address signals DA8B9B, DA89B, DA8B9 and DA89 become (0, 1, 0, 0), thereby accessing the second memory cell array block 202. When the address (A8, A9) is (1, 0), the first through fourth address signals A8B9B, A89B, A8B9 and A89 become (0, 1, 0, 0) and the first through fourth internal address signals DA8B9B, DA89B, DA8B9 and DA89 become (0, 0, 1, 0), thereby accessing the third memory cell array block 203. When the address (A8, A9) is (0, 1), the first through fourth address signals A8B9B, A89B, A8B9 and A89 become (0, 0, 1, 0) and the first through fourth internal address signals DA8B9B, DA89B, DA8B9 and DA89 become (0, 0, 0, 1), thereby accessing the fourth memory cell array block 204.

When the address (A8, A9) is (1, 1), the first through fourth address signals A8B9B, A89B, A8B9 and A89 become (0, 0, 0, 1) and the first through fourth internal address signals DA8B9B, DA89B, DA8B9 and DA89 become (0, 0, 0, 0). Thus, no memory cell array block is available for this address, reflecting a reduction in the capacity of the semiconductor memory device due to the failed memory cell array block.

Thus, when the address (A8, A9) is applied as (0, 0), (1, 0) and (0, 1) in sequence, the first through third address signals A8B9B, A89B, and A8B9 are activated to a logic high in sequence, so that the second, third and fourth internal address signals DA89B, DA8B9 and DA89 are activated in sequence. Accordingly, the second, third and fourth memory cell array block 202, 203 and 204 are accessed in sequence, skipping the first memory cell array block 201 which is a failed memory cell array block. As a result, data can be written to or read from the second, third and fourth memory cell array blocks 202, 203 and 204 without error.

When two or more failed memory cell array blocks exist among the first through fourth memory cell array blocks 201, 202, 203 and 204, access is restricted to the good memory cell array blocks by appropriately cutting fuses in the control signal generator 105 of FIG. 3 and the selection signal generator 104 of FIG. 4. FIG. 5 shows the fuses of the selection signal generator 104 to be cut according to whether the memory cell array blocks 201–204 are good or failed. In FIG. 5, the symbol "F" indicates a fuse which should be cut in order to activate the corresponding control signal.

As described above, in the semiconductor memory device according to the present invention, the fuses corresponding to failed memory cell array blocks containing a failed memory cells are cut, so that only good memory cell array blocks are accessed and failed memory cell array blocks are skipped. Thus, the number of devices discarded as defective is reduced, thereby improving yield. The semiconductor memory device of the present invention can operate normally when it contains failed memory cell array blocks, even though the capacity of the memory is decreased.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device comprising:

a plurality of memory cell array blocks, wherein each memory cell array block comprises a plurality of memory cells, each memory cell being either good or defective;

address decoding circuitry for receiving an address;

a selection signal generator for generating a selection signal indicating which blocks have good memory cells and which blocks have at least one bad memory cell; and a multiplexer responsive to the address decoding circuitry and the selection signal for generating an internal address for accessing memory cell array blocks having good memory cells and skipping memory cell array blocks having at least one defective memory cell.

2. The semiconductor memory device of claim 1, wherein the address decoding circuitry comprises a plurality of fuses for designating which memory cell array blocks have only good memory cells and which memory cell array blocks have at least one defective memory cell, the fuses being adapted to be cut, and wherein the at least one selection signal is generated according to which fuses are cut.

3. The semiconductor memory device of claim 1, further comprising:

a buffer for buffering the internal address of the multiplexer for accessing the memory cell array blocks and for enabling only the internal address corresponding to the memory cell array blocks having only good memory cells in response to at least one control signal.

4. The semiconductor memory device of claim 3, further comprising:

a control signal generator including a plurality of fuses, the fuses being adapted to be cut, for generating the at least one control signal when a corresponding fuse is cut; wherein the selection signal generator includes a plurality of fuses, the fuses being adapted to be cut, for generating the selection signal when a corresponding fuse is cut.

5. A semiconductor memory device comprising:

a plurality of memory cell array blocks, wherein each memory cell array block comprises a plurality of memory cells, each memory cell being either good or defective;

address decoding circuitry for receiving and decoding a first address, decoding the first address to provide a plurality of address signals, the address signals corresponding to the first address;

a selection signal generator that generates a selection signal indicating which blocks have good memory cells and which blocks have at least one bad memory cell; and a multiplexer responsive to the first address and the selection signal for generating an internal address signal;

wherein if the memory device has no memory cell array block having at least one defective memory cell, the internal address is the same as the first address, and if the memory device has at least one memory cell array block having at least one defective memory cell, the internal address is different from the first address.

6. The semiconductor memory device of claim 5, wherein if the memory device has at least one memory cell array block having at least one defective memory cell, the internal address is greater than the first address.

7. The semiconductor memory device of claim 6, wherein if the memory device has at least one memory cell array block having at least one defective memory cell, the internal address is greater than the first address by the number of memory cell array blocks having defective memory cells.

8. A method for addressing a plurality of memory cell array blocks in a semiconductor memory device, said method comprising:

determining which memory cell array blocks of the plurality of memory cell array blocks have at least one defective memory cell;

receiving a first address providing for access to one of the memory cell array blocks;

decoding the first address to provide a plurality of address signals, the address signals corresponding to the first address; and generating a selection signal that indicates which memory cell array blocks have good memory cells and which memory cell array blocks have bad memory cells;

multiplexing the first address and the selection signal to generate an internal address;

wherein if the memory device has no memory cell array block having at least one defective memory cell, the internal address is the same as the first address, and if the memory device has at least one memory cell array block having at least one defective memory cell, the internal address is different from the first address.

9. The method of claim 8, wherein if the memory device has at least one memory cell array block having at least one defective memory cell, the internal address is greater than the first address.

10. The method of claim 9, wherein if the memory device has at least one memory cell array block having at least one defective memory cell, the internal address is greater than the first address by the number of memory cell array blocks having defective memory cells.

* * * * *